United States Patent
Inaba et al.

(10) Patent No.: US 6,875,326 B2
(45) Date of Patent: Apr. 5, 2005

(54) PLASMA PROCESSING APPARATUS WITH REAL-TIME PARTICLE FILTER

(75) Inventors: Hiroshi Inaba, Yokohama (JP); Shinji Sasaki, Yokohama (JP); Shinya Hirano, Yokohama (JP); Kenji Furusawa, Hiratsuka (JP); Minoru Yamasaka, Chigasaki (JP); Atsushi Amatatsu, Naka (JP); Shi Xu, Singapore (SG)

(73) Assignees: Hitachi, Ltd., Tokyo (JP); Nanofilm Technologies International PTE, Ltd., Singapore (SG)

( * ) Notice: Subject to any disclaimer, the term of this patent is extended or adjusted under 35 U.S.C. 154(b) by 128 days.

(21) Appl. No.: 10/319,695

(22) Filed: Dec. 16, 2002

(65) Prior Publication Data

US 2003/0094366 A1 May 22, 2003

Related U.S. Application Data

(63) Continuation of application No. 09/644,072, filed on Aug. 23, 2000, now Pat. No. 6,638,403.

(30) Foreign Application Priority Data

Jul. 7, 2000 (JP) .................................... 2000-207290

(51) Int. Cl.[7] .......................... C23C 14/00; C23C 16/00
(52) U.S. Cl. .......................... 204/298.41; 118/723 HC
(58) Field of Search .................. 204/298.11, 298.16, 204/298.17, 298.18, 298.19, 298.2, 298.21, 298.22; 118/723 MR, 723 MA, 723 I, 723 IR, 723 AN, 723 E, 723 ER, 504, 723 HC, 723 VE, 723 R; 156/345.3, 345.42, 345.46, 345.49; 315/111.21, 111.41

(56) References Cited

U.S. PATENT DOCUMENTS

| | | | |
|---|---|---|---|
| 4,217,855 A | 8/1980 | Takagi | |
| 5,279,723 A | 1/1994 | Falabella et al. | |
| 5,282,944 A | 2/1994 | Sanders et al. | |
| 5,317,235 A | 5/1994 | Treglio | |
| 5,468,363 A | 11/1995 | Falabella | |
| 5,476,838 A | 12/1995 | Wordenweber et al. | |
| 5,480,527 A | 1/1996 | Welty | |
| 6,026,763 A | 2/2000 | Kim et al. | |

FOREIGN PATENT DOCUMENTS

| JP | 8-7219 | 1/1996 |
|---|---|---|
| JP | 8-333195 | 12/1996 |
| WO | 96/26531 | 8/1996 |

*Primary Examiner*—Luz Alejandro-Mulero
(74) *Attorney, Agent, or Firm*—Antonelli, Terry, Stout & Kraus, LLP

(57) ABSTRACT

A plasma processing device include a plasma generation unit for generating plasma by using a cathodic arc discharge, first and second magnetic field ducts arranged in a row for transporting the plasma with one end of the row being connected to the plasma generation unit and a processing chamber connected to the other end of the row unit and having a stage for holding a substrate to be processed. A shutter is provided for covering the plasma during a period of a predetermined time after start of arc discharge or during a period of predetermined time before end of arc discharge. The shutter is disposed between the first magnetic field duct and the substrate to be processed, and is movable. The shutter is capable of being supplied with a voltage, and is kept in a state so as to be electrically insulated from the processing chamber.

2 Claims, 16 Drawing Sheets

SECTIONAL VIEW

RATIO OF SECTIONAL AREA OF NEUTRAL
PARTICLE FILTER PENETRATION HOLE AND
SECTIONAL AREA OF MAGNETIC FIELD DUCT

×100  SIZE OF 2.5×7μm

×100   SIZE OF Φ1μm

PLASMA PROCESSING APPARATUS WITH REAL-TIME PARTICLE FILTER

This is a continuation of U.S. application Ser. No. 09/644,072, filed Aug. 23, 2000, now U.S. Pat. No. 6,638,403, the subject matter of which is incorporated by reference herein.

BACKGROUND OF THE INVENTION

The present invention relates to a plasma processing device, and in particular to a plasma processing device using a cathodic arc discharge.

In recent years, study of a thin film deposition technique using a low pressure arc discharge has been vigorously conducted. In such a technique, an arc discharge is generated by bringing an electrode generally called striker in mechanical contact with a target portion serving as a cathode or by using an electron beam to let an arc current of several tens amperes flow into the target portion. Plasma is sustained by making ions from plasma hump generated in an upper space of the target collide with the cathode and thereby generating ions and electrons from the cathode. Plasma including these ions and electrons is efficiently led to a vacuum reaction chamber by using a magnetic field duct for transportation and a magnetic field duct for scanning. The plasma is thus applied uniformly to a substrate to be processed. Thereby, processing such as thin film forming or etching is conducted.

When plasma is generated by an arc discharge in the above described conventional method, however, a large number of neutral particles having no electric charge or electrically charged particles are generated besides ions and electrons. These hamper the processing such as thin film forming or etching as particles, resulting in a great problem.

SUMMARY OF THE INVENTION

As a method for solving the above described problem, using a shape having at least one curvatures in a portion of the magnetic field duct or providing a ring-shaped trap mechanism inversely tapered in the travel direction of plasma generated in an internal wall portion of the magnetic field duct is disclosed in PCT/GB96/00389 Publication.

However, the following facts have been revealed by experiments of the present inventors. The above described technique brings about an effect in removal of neutral particles each having such a particle as to be observed easily by an optical microscope. However, the above described conventional technique extremely decreases the probability that neutral particles each having a particle diameter of at most 5 $\mu$m which occupy a greater part of generated particles are trapped on the inner wall of a magnetic field filter. Therefore, removal of such neutral particles each having a particle diameter of at most 5 $\mu$m is difficult. Furthermore, as for electrically charged particles each having a particle diameter of at most 5 $\mu$m, capture of them is difficult. It is thus necessary to find a new solution at the time of putting thin film formation and etching to practical use.

An object of the present invention is to provide a plasma processing device capable of removing mainly the above described particles each having a particle diameter of at most approximately 5 $\mu$m effectively.

In accordance with the present invention, particles included in plasma generated by an arc discharge are broadly classified into electrically charged particles and neutral particles, and an effective capture-removal method is proposed for each of them.

First of all, in order to remove the electrical charged particles each having a particle diameter of at most approximately 5 $\mu$m included in plasma, it is necessary to cause the plasma to be passed through at least one electric field filter supplied with a voltage, when leading the generated plasma to a processing chamber, in which a substrate to be processed is held, by using a first, magnetic field duct for plasma transportation and a second, magnetic field duct for applying the plasma uniformly onto the substrate to be processed.

To be concrete, it becomes possible to capture electrically charged particles included in the plasma efficiently in real time by setting a bias voltage applied to an electric field filter to a range of 10 V to 90 V as compared with an installation voltage. This utilizes the fact that each of electrically charged particles floating in the plasma has a negative potential. The reason is believed that it is covered with approximately several thousands electrons.

On the other hand, in order to efficiently capture and remove in real time the neutral particles flying out from the cathode target as a result of an arc discharge, a neutral filter having at least one penetration hole is disposed so as to be nearly perpendicular to the travel direction of the plasma, in a plasma transportation course between the first magnetic field duct and the substrate to be processed. The plasma transported through the first magnetic field duct is made to pass through this neutral filter.

At this time, the sum total of sectional areas of the penetration holes is made to be less than approximately 40% of the sectional area of the first magnetic field duct or the second magnetic field duct.

Furthermore, by covering a part of the surface of the above described neutral filter with an organic macromolecule material or a composite material including it, it becomes possible to prevent exfoliation of neutral particles stuck to the surface of the neutral filter and drastically decrease generation of secondary particles caused by the exfoliation of neutral particles.

BRIEF DESCRIPTION OF THE DRAWING

These and other features, objects and advantages of the present invention will become more apparent from the following description when taken in conjunction with the accompanying drawings wherein.

DESCRIPTION OF THE EMBODIMENTS

Figure 1:
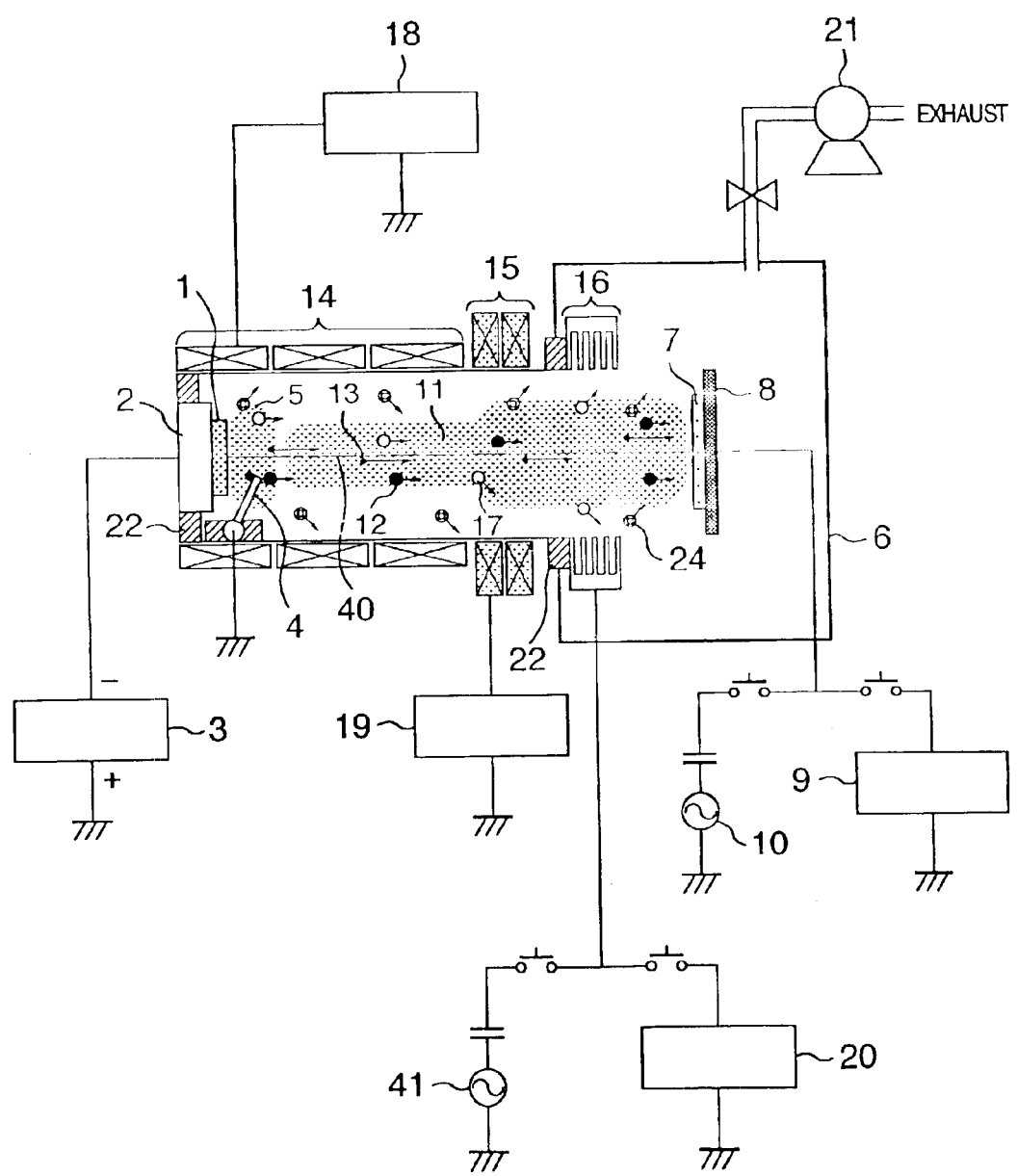
FIG. 1 is a schematic diagram of a plasma processing device having an electric field filter showing a first embodiment.

Hereafter, embodiments of the present invention will be described in detail by referring to the drawing.

FIG. 1 is a schematic configuration diagram showing a first embodiment of a plasma processing device according to the present invention. Numeral 1 denotes a target, 2 a cathode, 3 an arc supply, 4 a striker, 5 an arc discharge, 6 a processing chamber, 7 a substrate to be processed, 8 a stage, 9 a direct current supply, 10 a high frequency supply, 11 plasma, 12 a positive carbon ion, 13 an electron, 14 a first magnetic field duct, 15 a second magnetic field duct, 16 an electric field filter, and 17 an electrically charged particle. Numerals 18, 19 and 20 denote direct current supplies. Numeral 21 denotes an exhaust pump, 22 an insulating member, and 24 a neutral particle. Numeral 40 denotes vicinity of a central axis of the magnetic field duct 14. Numeral 41 denotes a high frequency supply.

With reference to FIG. 1, a graphite carbon with high crystal orientation is used as an example of a material of the target 1. Its diameter is approximately 50 mm. The target 1 is joined to the cathode 2 disposed at one end portion in the first magnetic field duct 14. The cathode 2 is insulated from the first magnetic field duct 14 by the insulating member 22. In the vicinity of the target 1 within the first magnetic field duct 14, the striker 4 for causing an arc discharge is disposed. A second magnetic field duct 15 is coupled to the other end portion of the first magnetic field duct 14. In addition, the processing chamber 6 is coupled to the second magnetic field duct 15 via the insulating member 22.

The striker 4 supplied with an arc current in the range of 20 to 150 A and an arc voltage of approximately −30 V from an arc supply 3 via the cathode 2 is brought into contact with the target 1 joined to the cathode 2. Thereby, an arc discharge 5 is caused between the target 1 and the striker 4.

It is desirable that the striker 4 has such a structure that when the arc discharge 5 has become unstable the striker can be brought into contact with the surface of the target 1 again in order to sustain the arc discharge 5 steadily.

Furthermore, the vacuum pressure (back pressure) of the first magnetic field duct 14, the second magnetic field duct 15, and the processing chamber 6 at the time when starting the arc discharge 5 is set equal to, for example, at most approximately $5\times10^{-5}$ Pa by using the exhaust pump 21. As a result, it is possible to reduce the quantity of adsorption of water molecules existing on the surface of the substrate 7 to be processed.

The stage 8 disposed in the processing chamber 6 to mount the substrate 7 to be processed is connected to the direct current supply 9 and the high frequency supply 10 for applying a positive or negative voltage. In the present embodiment, however, the stage 8 is placed in the floating state with respect to the ground voltage.

By flowing a current from the supply 18 to a magnet disposed around the first magnetic field duct 14 for plasma transportation taking the shape of a cylindrical shape (having approximately 0.05T (500 Gauss) in the vicinity of the center of the first magnetic field duct 14), positive carbon ions 12 and electrons 13 forming principal components of plasma 11 generated by the target 1 are trapped nearly in the vicinity 40 of the central axis of the first magnetic field duct 14 while conducting a cyclotron motion, and transported to the second magnetic field duct 15 in a beam form.

In the same way as the first magnetic field duct 14, a magnet is disposed around the second cylindrical-shaped magnetic field duct 15. By flowing a current into the magnet from the direct current supply 19, a beam shaped plasma 11 transported from the first magnetic field duct 14 is swung. The surface of the substrate 7 to be processed is scanned with the beam shaped plasma 11. As a result, a layer or carbon is formed uniformly.

Figure 2A:
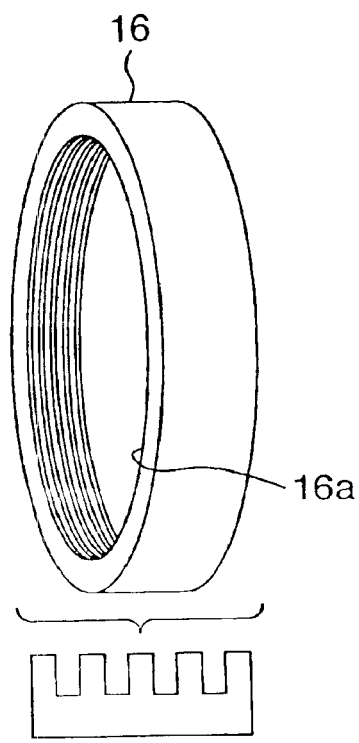
FIG. 2A is a diagram showing the structure of an electric field filter.
Figure 2B:
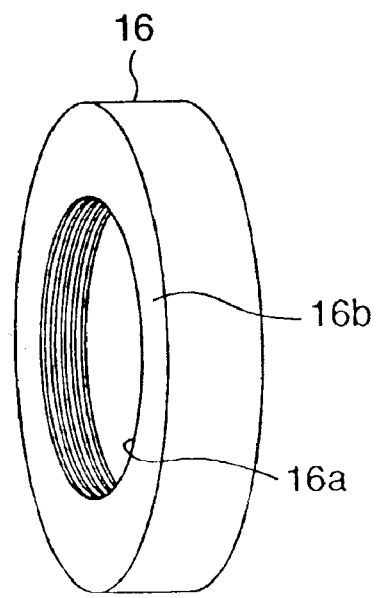
FIG. 2B is a diagram showing the structure of an electric field filter having a smaller diameter of an opening portion.

In the first embodiment, an electric field filter 16 having an opening portion 16a, for example, as shown in FIGS. 2A and 2B is installed between the second magnetic field duct 15 and the substrate 7 to be processed, as a real-time particle filter. The electric field filter 16 is electrically insulated from the insulating member 22. FIG. 2A shows the electric field filter 16 taking the shape of a cylinder. The opening portion 16a has a diameter which is close to the external shape dimension of the electric field filter 16 (which is greater than the inside diameter of the first magnetic field duct 14). Even if the substrate 7 to be processed is large and the swinging range of the plasma 11 is wide, therefore, the plasma 11 passes through the opening portion 16a and the flow of the plasma 11 is not obstructed. On the other hand, in the case where the substrate 7 to be processed is small, the diameter of the opening portion 16a of the electric field filter 16 can be made small as shown in FIG. 2B. In this case as well, however, the diameter is set to such a value as not to obstruct the passage of the plasma 11 swung by the action of the second magnetic field duct 15.

The electric field filter 16 is made of aluminum alloy, stainless alloy, or metal containing copper. The inner wall of its opening portion 16a takes an uneven shape (such as a cornice shape or a shape having a helical groove). A positive voltage is applied to the electric field filter 16. As a result, negative charged particles 17 floating in plasma 11 passed through the electric field filter 16 are captured by the electric field filter 16. Therefore, the plasma 11 with most of electrically charged particles 17 removed is applied to the surface of the substrate 7 to be processed.

In this way, the electric field filter 16 captures the electrically charged particles 17 in the middle of the flow from the second magnetic field duct 15 toward the substrate 7 to be processed. During the plasma processing, the electrically charged particles 17 can thus be removed in real time.

Providing the inner wall of the opening portion 16a of the electric field filter 16 with an uneven shape as described above brings about an effect of widening the effective area for capturing the electrically charged particles 17 and increasing the capture quantity of the electrically charged particles 17. Furthermore, capture of neutral particles described later is also possible.

Furthermore, in the first embodiment, the sectional shape of the first magnetic field duct 14 is made, for example, circular. Whereas the inside diameter of the first magnetic field duct 14 is 200 mm, the inside diameter of the electric field filter 16 having the configuration shown in FIG. 2A is made 200 mm, or larger than that of the first magnetic field duct, for example, 205 mm. As a result, the transported plasma 11 including ions and electrons can be efficiently applied to the surface of the substrate 7 to be processed.

In the case where the electric field filter 16 having the configuration shown in FIG. 2B is used in the same way, the electrically charged particles 17 and neutral particles described later are captured on the surface 16b of the electric field filter 16 as well.

Figure 3:
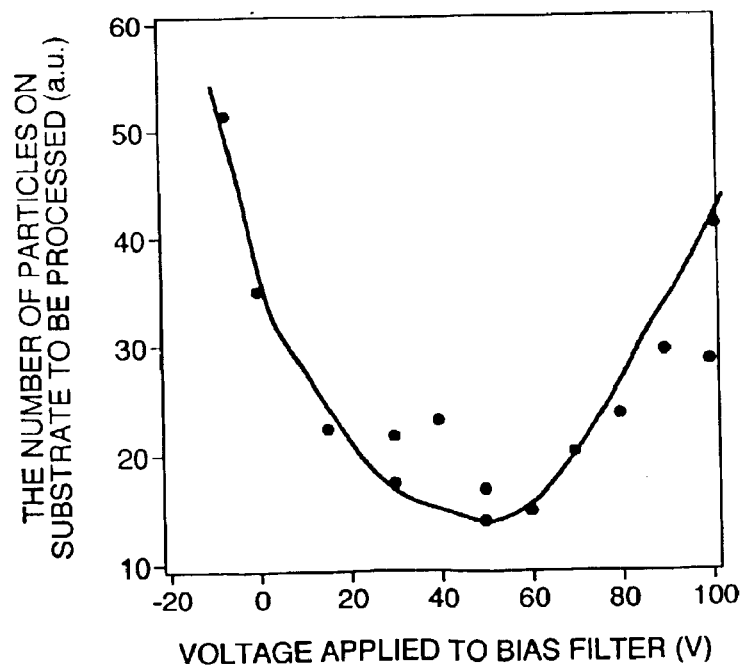
FIG. 3 is a diagram showing the relation between a voltage applied to the electric field filter and particles arriving at a substrate.

FIG. 3 is a diagram showing a change value of electrically charged particles 17 coming flying to the surface of the substrate 7 to be processed in the first embodiment, in the case where the electric field filter 16 having the configuration shown in FIG. 2A is used.

There is shown the case where the voltage applied to the electric field filter 16 was changed from −20 V to 100 V as compared with the installation voltage by using the direct current supply 20. This measurement was conducted on electrically charged particles each having a particle diameter of at least 1 $\mu$m, by using, for example, laser surface inspection device "LS-6000" manufactured by Hitachi Electronic Engineering Ltd. The measurement was conducted with an arc current of 20 A and arc discharge time of 190 seconds.

As a result, the quantity of electrically charged articles 17 coming flying to the surface of the substrate 7 to be processed is decreased abruptly by changing the voltage applied to the electric field filter 16 plus from minus, as shown in FIG. 3. By making the applied voltage larger, the quantity of electrically charged articles 17 coming flying to the surface of the substrate 7 to be processed is increased again. When the applied voltage is approximately 50 V, it has become possible to extremely decrease the quantity of electrically charged articles 17 coming flying to the surface of the substrate 7 to be processed.

As one example, in the present embodiment, the voltage applied to the electric field filter 16 is set equal to a voltage in the range of 10 V to 90 V with respect to the ground voltage, on the basis of the experimental result. In the case where the electrically charged particles 17 are to be further reduced, the applied voltage is set equal to a voltage in the range of 20 V to 70 V, or more preferably a voltage in the range of 40 V to 60 V. The same holds true of the electric field filter 16 having the configuration shown in FIG. 2B.

By the way, by sticking an organic macromolecule material which causes a chemical reaction with carbon atoms and exhibits high adhesion (to be concrete, for example, a polyimide film) to the inner wall surface of the opening portion 16a of the electric field filter 16, there is increased an effect of preventing exfoliation of a film formed of electrically charged particles deposited on the surface of the electric field filter 16. For example, by applying a direct current voltage component of approximately 50 V generated by using the high frequency supply 41 to the electric field filter 16 with such an organic macromolecule material stuck thereon, a stable arc discharge can be sustained. In addition, the electrically charged articles 17 included in the plasma 11 can be captured efficiently in the same way as the above described case. In addition, it has been ascertained that this brings about an effect of preventing the film formed of electrically charged particles deposited on the surface of the electric field filter 16 from exfoliating inadvertently.

In the electric field filter 16 having the configuration shown in FIG. 2B, a similar organic macromolecule material is provided also on the surface 16b other than the opening portion 16a. By doing so, there is increased an effect of preventing exfoliation of a film formed of the electrically charged particles 17 and neutral particles described later, deposited thereon.

In the case where the inner wall surface of the opening portion of the electric field filter 16 is a conductive surface, a direct current voltage in the above described voltage range from the direct current supply 20 is applied to the electric field filter 16. When a member containing an electrically insulative organic macromolecule material, such as a polyimide film, is provided on the inner wall surface, however, a direct current voltage component in the above described voltage range generated by using the high frequency supply 41 is applied to the electric field filter 16.

Figure 4:
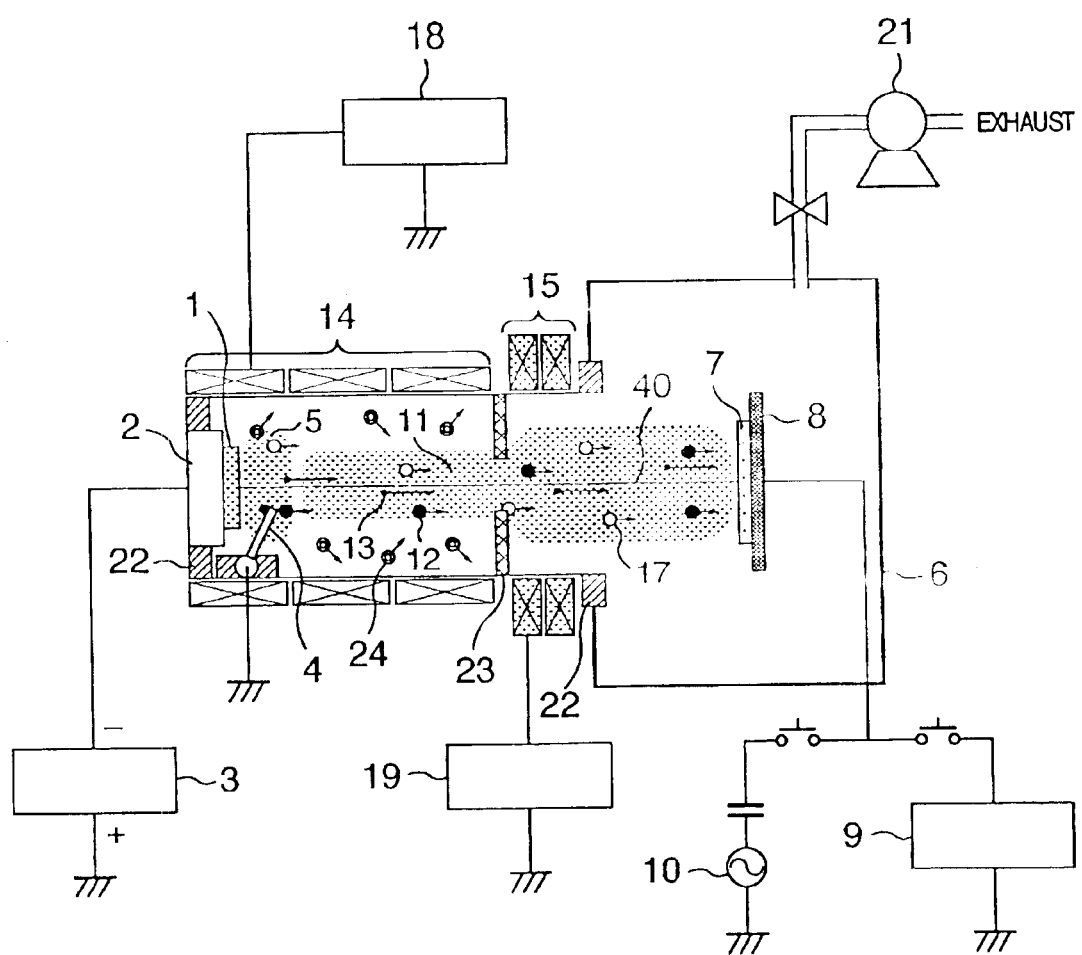
FIG. 4 is a schematic diagram of a plasma processing device having a neutral filter showing a second embodiment.

FIG. 4 is a schematic configuration diagram showing a second embodiment of a plasma processing device according to the present invention. Numeral 23 denotes a neutral filter. Components corresponding to those of FIG. 1 are denoted by like numerals, and description thereof will be omitted.

With reference to FIG. 4, plasma 11 generated by an arc discharge 5 is passed through a first magnetic field duct 14 and a second magnetic field duct 15, and transported into a processing chamber 6 having a stage 8 on which a substrate 7 to be processed is mounted, in the same way as the first embodiment. In the second embodiment, however, a neutral filter 23 serving as a real-time particle filter is disposed between the first magnetic field duct 14 and the substrate 7 to be processed so as to capture, in real time, neutral particles 24 floating in the plasma 11 transported for plasma processing. In the second embodiment, a platelike neutral filter 23 is disposed so as to be nearly perpendicular to the travel direction of the plasma 11.

This neutral filter 23 has at least one penetration hole 25 having an opening sectional area which is smaller than the internal sectional area of the first magnetic field duct 14. As for the material thereof, the neutral filter 23 is made of, for example, stainless alloy subjected to blast processing at its surface. Electrically, the neutral filter 23 is set to the same potential as the first magnetic field duct 14.

By using such a neutral filter 23, the neutral particles 24 floating in the plasma 11 can be captured. Its situation is shown in FIGS. 5A and 5B.

Figure 5A:
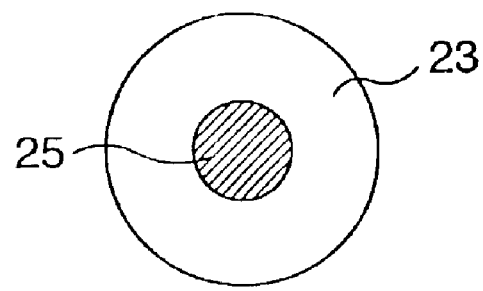
FIG. 5A is a diagram showing a section of a neutral filter.

FIG. 5A shows a section of the neutral filter 23. A shaded portion is a penetration hole 25. In the second embodiment, one penetration hole 25 is formed nearly in the center of the neutral filter 23. However, the penetration hole 25 is not limited to this position. As a matter of course, a plurality of penetration holes may be formed around the center.

Figure 5B:
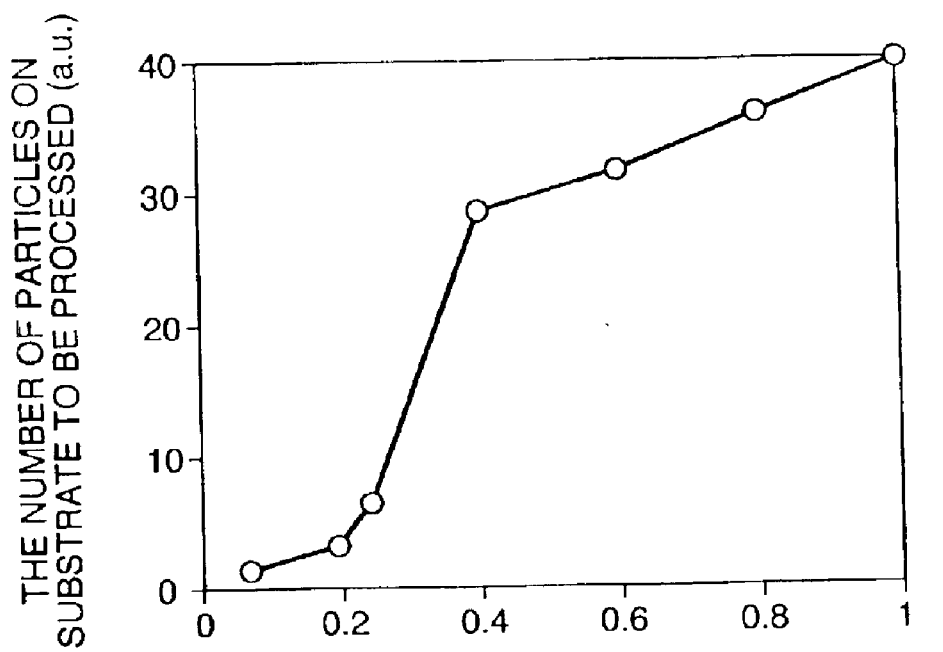
FIG. 5B is a diagram showing the relation between the quantity of the neutral particles arriving at a substrate and the opening sectional area of a penetration hole of the neutral filter.

FIG. 5B shows the relation between the quantity of the neutral particles 24 arriving at the substrate 7 to be processed and the opening sectional area of the penetration hole 25 of the neutral filter 23. As the opening sectional area of the penetration hole 25 is made smaller as compared with the sectional area of the first magnetic field duct 14, the quantity of the neutral particles 24 arriving at the surface of the substrate 7 to be processed decreases, as apparent from FIG. 5B as well. Especially, if the opening sectional area of the penetration hole 25 becomes at most approximately 40% of the internal sectional area of the first magnetic field duct 14, the quantity of the neutral particles 24 abruptly decreases. Furthermore, if the opening sectional area of the penetration hole 25 becomes at most approximately 25%, the quantity of the neutral particles 24 sharply decreases.

According to a result of study conducted by the present inventors as to the shape and arrangement of the penetration hole 25, a result similar to that of FIG. 5B can be obtained, even in the case where a multi-hole shape formed of a large number of penetration holes each having a diameter smaller than that of the above described example is used, or the penetration holes are disposed in the peripheral part of the neutral filter 23 (peripheral part of the inner wall in the first magnetic field duct). If the sum total of the opening sectional areas of the penetration holes 25 becomes at most approximately 40% of the internal sectional area of the first magnetic field duct 14, the quantity of the neutral particles 24 abruptly decreases. Furthermore, if the sum total becomes at most approximately 25%, the quantity of the neutral particles 24 sharply decreases.

Figure 6:
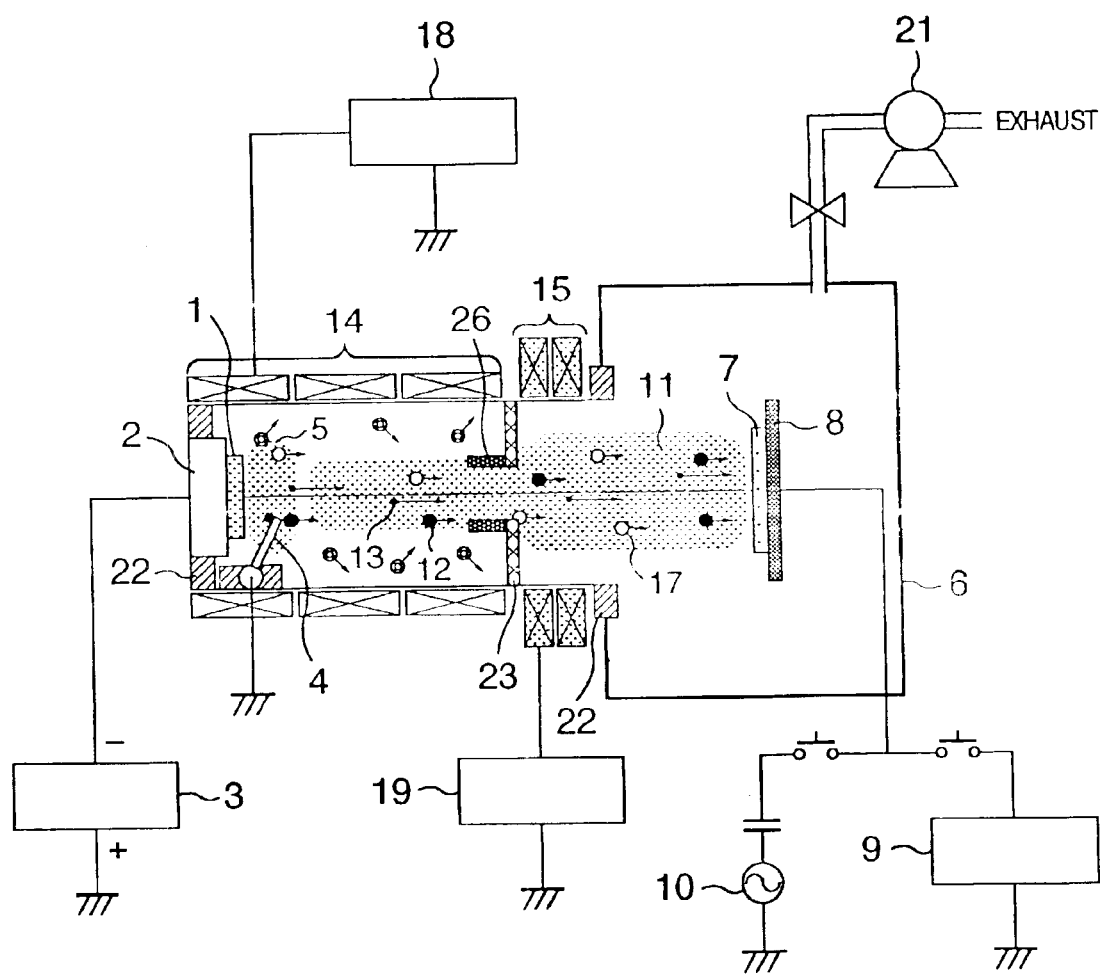
FIG. 6 is a schematic diagram of a plasma processing device having a neutral filter showing a third embodiment.

Furthermore, even if the shape of the neutral filter 23 is not platelike and a cylindrical member 26 is disposed around the penetration hole 25 on the surface of the neutral filter 23 as in a third embodiment shown in FIG. 6, a similar effect can be obtained.

Figure 7:
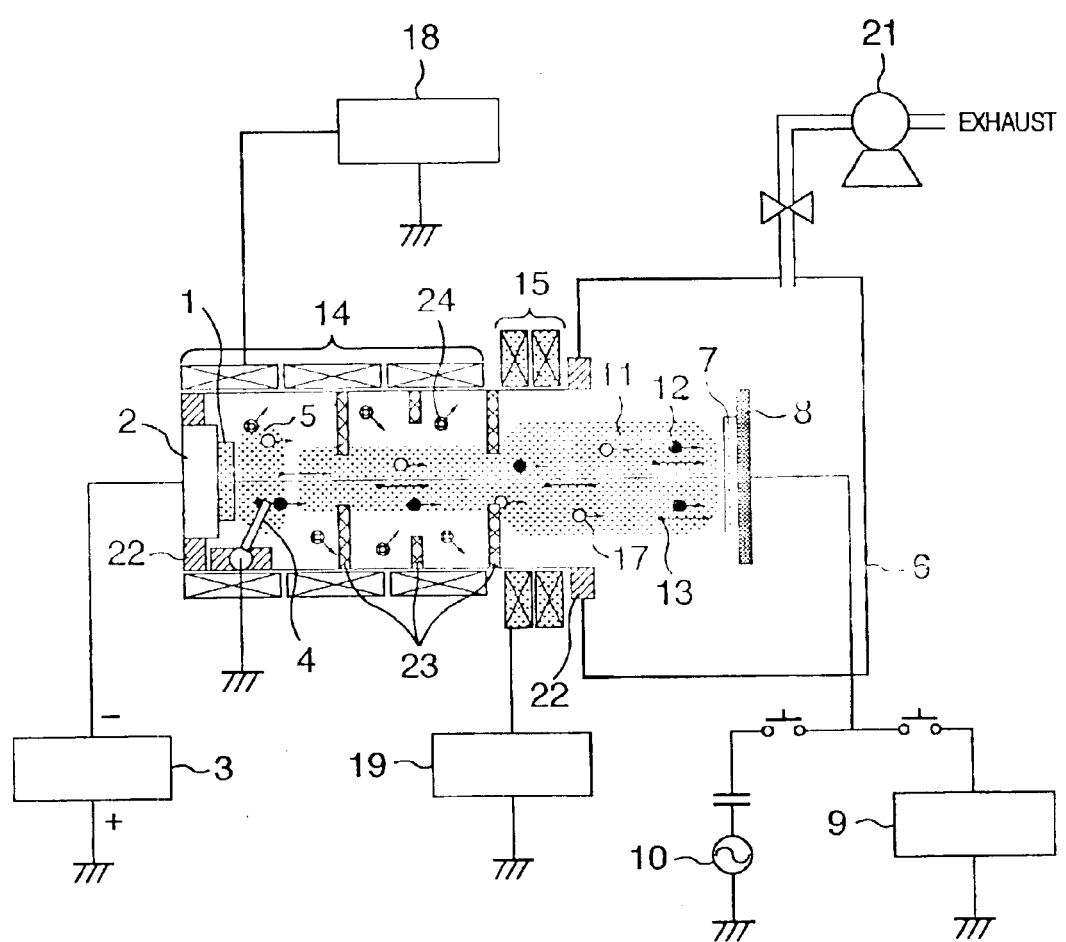
FIG. 7 is a schematic diagram of a plasma processing device having a plurality of neutral filters showing a fourth embodiment.

FIG. 7 is a schematic configuration diagram showing a fourth embodiment of a plasma processing device according to the present invention. Components corresponding to those of FIG. 4 are denoted by like numerals, and description thereof will be omitted.

With reference to FIG. 7, the fourth embodiment differs from the second embodiment shown in FIG. 4 in that a plurality of neutral filters 23 differing in opening area of the penetration hole 25 are disposed also inside the first magnetic field duct 14 through which the plasma 11 is transported. In FIG. 7, the neutral filters 23 are disposed in two positions within the first magnetic field duct 14 and in one position between the first magnetic field duct 14 and the second magnetic field duct 15. Thus the neutral filters 23 are disposed in three positions in total. For each of the neutral filters 23 installed in the three positions, the sum total of the opening sectional areas of the penetration holes 25 is made at most approximately 40% of the internal sectional area of the first magnetic field duct 14.

As a result of an experiment similar to that of the case of FIG. 4 conducted on such a configuration, the neutral particles 24 floating in the plasma 11 could be captured efficiently. The reason is that the respective neutral filters 23 capture the neutral particles 24 moving on random paths. In other words, neutral particles 24 which are not captured by a first neutral filter 23 are captured by a second neutral filter 23, and neutral particles 24 which are not captured by the first and second neutral filters 23 are captured by a third neutral filter 23. In addition, it was ascertained that the capture efficiency of the neutral particles 24 could be improved by setting the sum total of opening sectional areas of the penetration holes 25 for each of the neutral filters 23 equal to at most approximately 25% of the internal sectional area of the first magnetic field duct 14.

In FIG. 7, the neutral filters are disposed in three positions. However, the neutral filters may be disposed in two positions, or in four or more positions. In these cases as well, an effect similar to the above described effect is obtained by setting the sum total of opening sectional areas of the penetration holes 25 for each of the neutral filters 23 as described above.

Figure 8A:
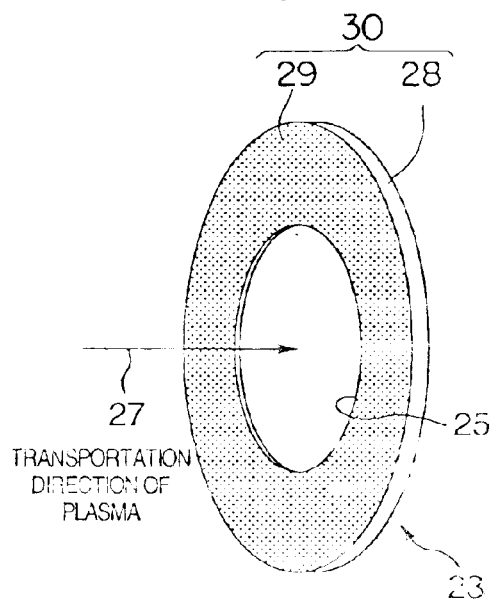
FIG. 8A is a schematic structure diagram of a neutral filter.

On the other hand, in the embodiments shown in FIG. 4, FIG. 6 and FIG. 7, a member 29 made of an organic macromolecule material is provided over a whole face of a side of the neutral filter 23 disposed so as to be nearly perpendicular to the transportation direction 27 of the plasma 11, through which the plasma 11 flows in, as shown in FIG. 8A. Here, the neutral filter 23 is formed, as one example, obtained by providing a composite member 30 (having a plate thickness of approximately 1 mm) composed of a glass fiber inprignated with polyimide on the surface of paletlike member 28.

Figure 9:
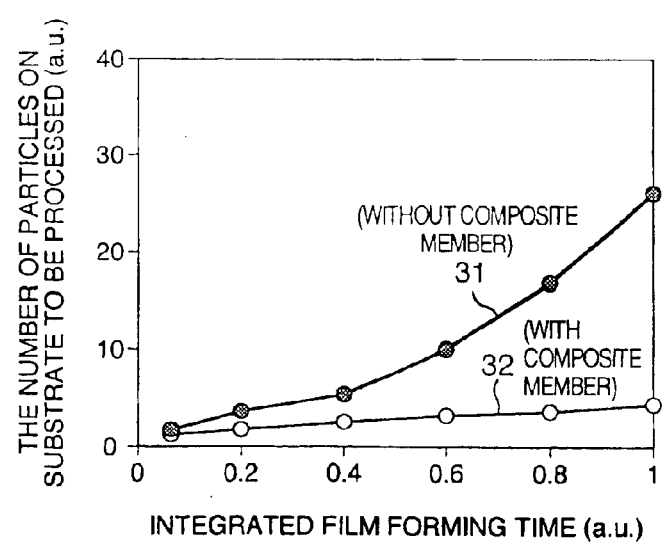
FIG. 9 is a diagram showing an effect of the neutral filter having a composite member.

As regards the above described embodiments using the neutral filter 23 having such a configuration, an experiment similar to that of FIG. 4 or 7 was conducted. A result shown in FIG. 9 was obtained. As apparent from this result, the neutral particles 24 coming flying to the surface of the substrate 7 to be processed tend to increase as the continuation time of the arc discharge increases. As compared with the case where the above described composite member 30 is not used (graph 31 of FIG. 9), however, the quantity of the neutral articles 24 coming flying to the surface of the substrate 7 to be processed can be decreased in the case where the composite member 30 is used (graph 32 of FIG. 9).

In other words, when the plasma 11 is transported within the first magnet field duct 14, the composite member 30 efficiently captures the neutral particles 24 floating in the plasma 11. In addition, it has been ascertained that the composite member 30 plays a role of effectively preventing exfoliation of a film formed of the neutral particles 24 deposited on the surface of the composite member 30, as compared with the case where the composite member 30 is not attached.

The neutral filter 23, as shown in FIG. 8A, is formed as the composite member 30 including a member 29 made of an organic macromolecule material which is provided over a whole face of a side of a platelike member 28 having a penetration hole 25, through which the plasma 11 flows. Alternatively, however, as for example, the composite member 30 made by providing polymide film 29' in a part of the platelike member 28 and around the penetration hole 25 as shown in FIG. 8B.

Figure 10:
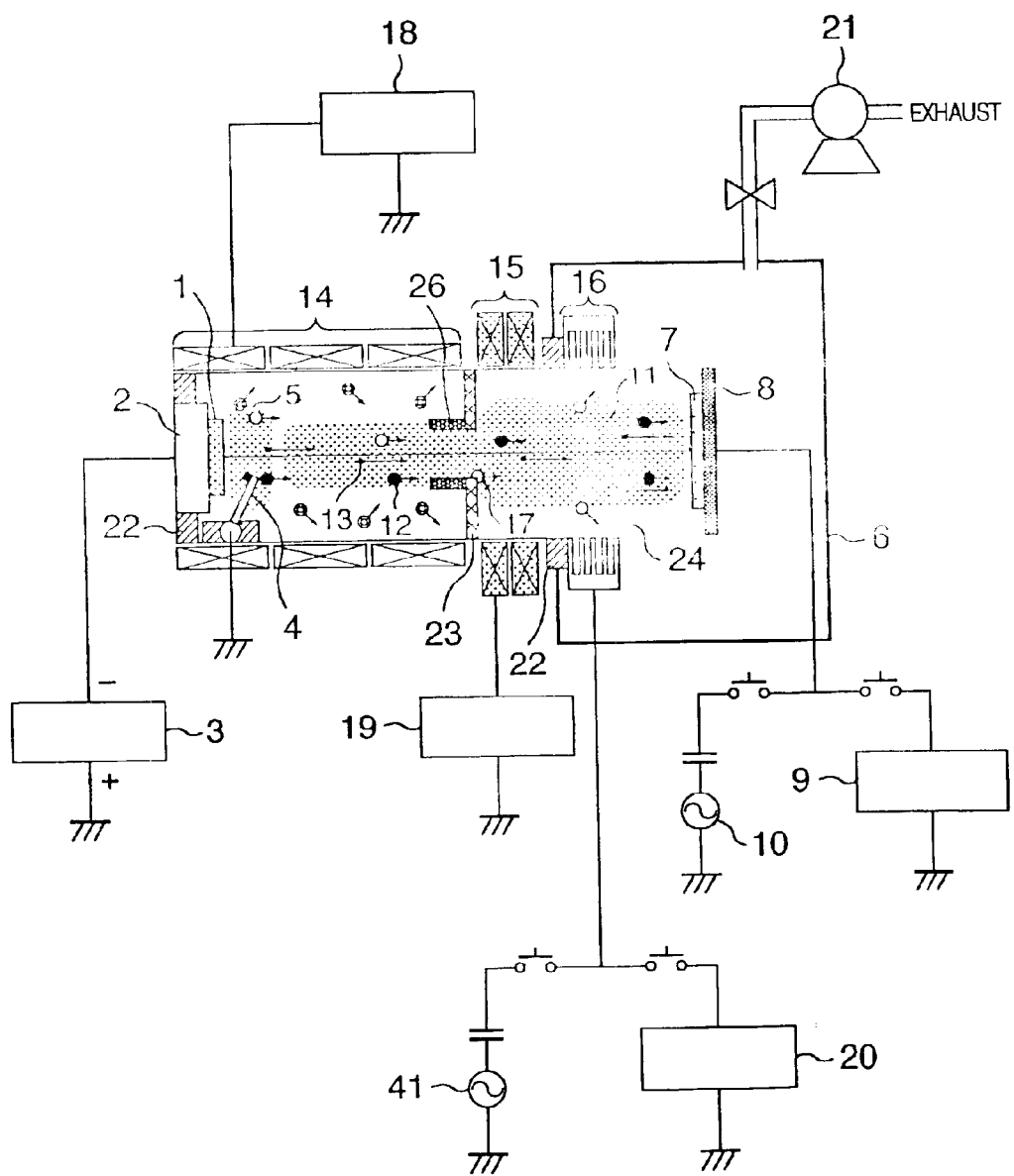
FIG. 10 is a schematic diagram of a plasma processing device showing a fifth embodiment.

FIG. 10 is a schematic configuration diagram showing a fifth embodiment of a plasma processing device according to the present invention. Components corresponding to those of FIG. 6 are denoted by like numerals, and description thereof will be omitted.

With reference to FIG. 10, the fifth embodiment differs from the third embodiment shown in FIG. 6 in that an electric field filter 16 is disposed between the second magnetic field duct 15 and the substrate 7 to be processed. Therefore, a neutral filter combined a cylindrical member 26 is disposed between the first magnetic field duct 14 and the second magnetic field duct 15, and the electric field filter 16 is disposed between the second magnetic field duct 15 and the substrate 7 to be processed, so as to be electrically insulated from a processing chamber 6 by an insulating member 22.

Figure 8B:
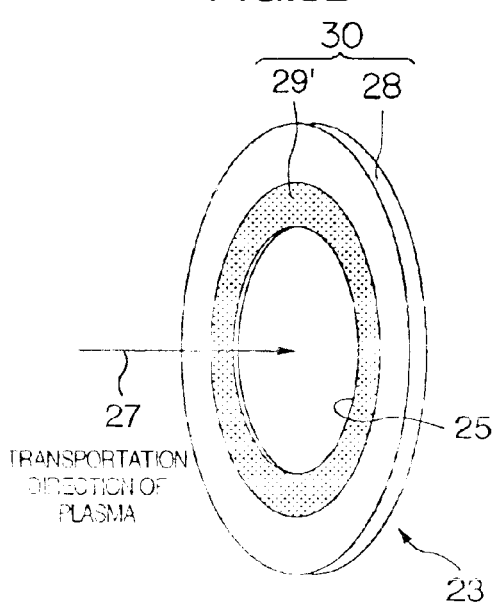
FIG. 8B is a schematic structure diagram of another neutral filter.

The neutral filter combined a cylindrical member 26 is formed of the composite material 30 (having a plate thickness of approximately 1 mm) as shown in FIG. 8A or 8B. Furthermore, a voltage of approximately 50 V from a direct current supply 20 is applied to the electric field filter 16. An arc current in the range of 20 to 150 A with an arc voltage of approximately −30 V from an arc supply 3 is applied between a target 1 and a striker 4 to cause an arc discharge.

Plasma 11 thus generated is transported inside the first magnetic field duct 14 and the second magnetic field duct 15, and applied to the surface of a substrate 7 to be processed. During that process, however, the neutral particles 24 floating within the plasma 11 are captured efficiently by the neutral filter combined a cylindrical member 26 and electrically charged particles 17 are captured efficiently by the electric field filter 16. As a result, only the plasma 11 with particles each having a size of at least approximately 1 $\mu$m drastically removed is applied to the surface of the substrate 7 to be processed.

As for the neutral filter 23, one neutral filter shown in FIG. 8A may be disposed as shown in FIG. 4, or a plurality of neutral filters each shown in FIG. 8A may be disposed as shown in FIG. 7. In this case, the neutral filter 23 need not be the composite member 30 shown in FIG. 8A. However, it is a matter of course that the above described effect is obtained more remarkably by using such a composite member 30.

Figure 11:
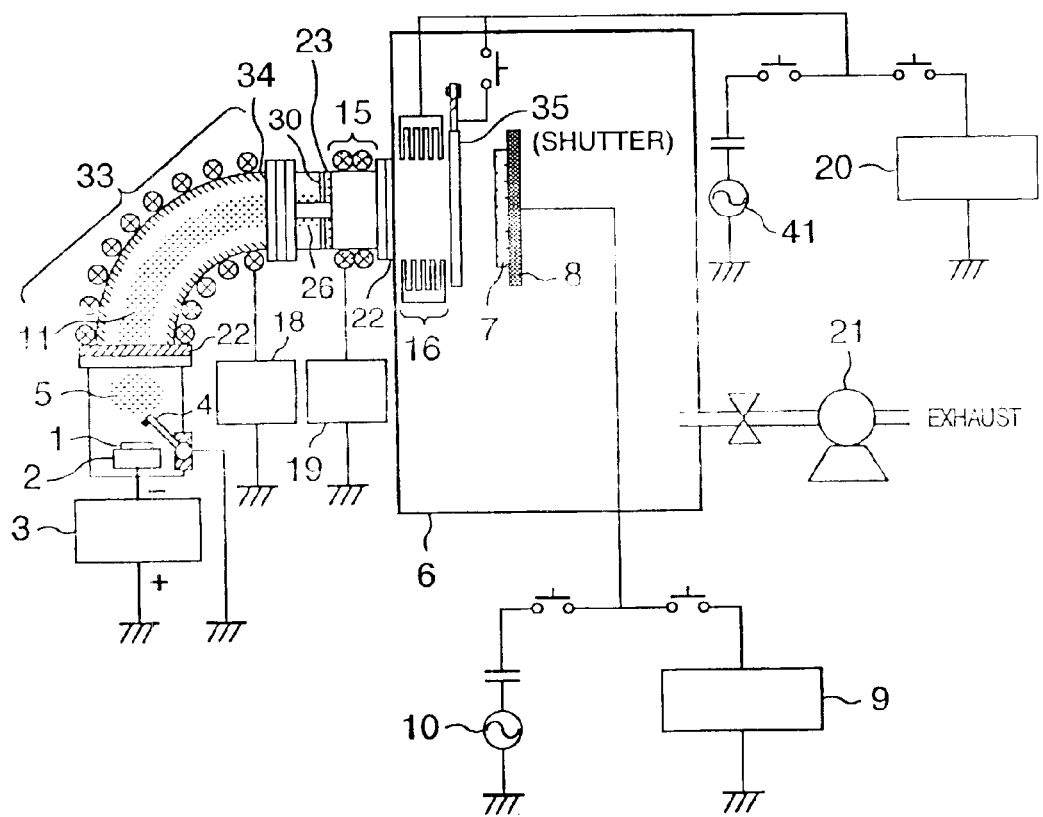
FIG. 11 is a schematic diagram of a plasma processing device showing a sixth embodiment.

FIG. 11 is a schematic configuration diagram showing a sixth embodiment of a plasma processing device according to the present invention. Numeral 33 denotes a first magnetic field duct, and numeral 34 denotes a baffle. Numeral 35 denotes a shutter. Components corresponding to the previous drawing are denoted by like numerals, and description thereof will be omitted.

With reference to FIG. 11, in the sixth embodiment, a first magnetic field duct 33 takes a bent shape. Furthermore, on the inner wall surface of the first magnetic field duct 33, baffles 34 each taking an inversely tapered shape in the travel direction of the plasma 11 are disposed. In addition, a neutral filter combined a cylindrical member 26 is disposed between the first magnetic field duct 33 and a second magnetic field duct 15, and in the same way as the embodiment shown in FIG. 10, an electric field filter 16 is disposed between the second magnetic field duct 15 and a substrate 7 to be processed.

Each of electrically charged particles and neutral particles generated by an arc discharge travels within the first magnetic field duct 33 in a random direction. Since the first magnetic field duct 33 is bent, these particles which have traveled along the central axis of the first magnetic field duct 33 also proceed toward the inner wall surface and captured by the baffles 34 disposed on the inner wall surface.

The neutral filter 23 has the same configuration as that used in the third embodiment shown in FIG. 6. However, the neutral filter 23 uses the configuration of the composite member 30 shown in FIG. 8A. The opening sectional area of the penetration hole formed in the composite member 30 is set equal to approximately 4% of the sectional area of the second magnetic field duct 15. In addition, an openable and closable shutter 35 is disposed between the electric field filter 16 and the substrate 7 to be processed.

Figure 12:
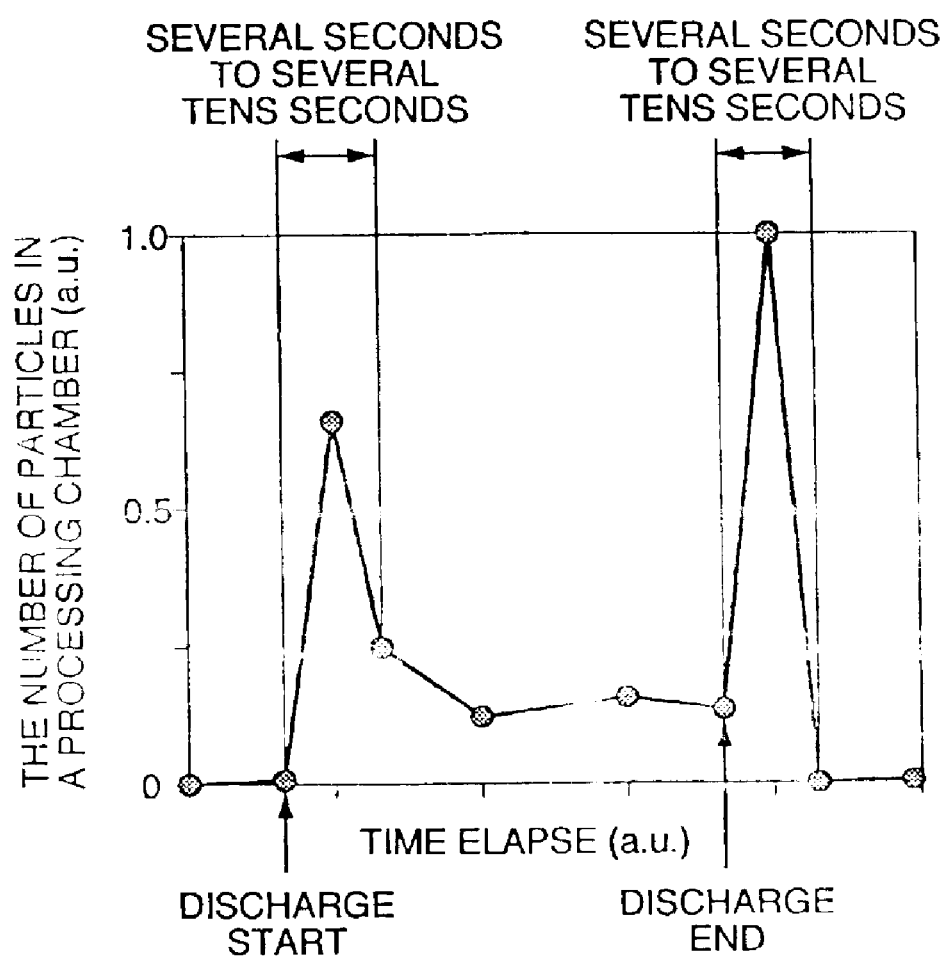
FIG. 12 is a diagram showing the relation between the process of an arc discharge and generated particles.

FIG. 12 shows the relation between the elapse of the continuation time of the arc discharge and the quantity of electrically charged particles and neutral particles floating in a processing chamber 6, in the sixth embodiment shown in FIG. 11.

As apparent from FIG. 12 as well, the quantity of particles floating within the processing chamber 6 abruptly increases, when time required for the generated plasma 11 to be transported to the processing chamber 6 has elapsed since the start of an arc discharge. As the time elapses thereafter, the quantity of particles floating within the processing chamber 6 gradually decreases. If the arc discharge ceases and some time has elapsed, then the quantity of particles floating within the processing chamber 6 increases again. In other words, it has been revealed that in the case of plasma generation caused by an arc discharge an extremely large number of particles are generated at the time of start and end of the arc discharge.

In the case of plasma processing utilizing an arc discharge, therefore, there is needed a contrivance for preventing particles included in the plasma from coming flying to the surface of the substrate 7 to be processed, at the time of start and end of the arc discharge.

The openable and closable shutter 35 (made of stainless alloy) shown in FIG. 11 is provided to fulfill the above described function. For example, during a period in the range of several seconds to several tens seconds after the start of the arc discharge, and during a period in the range of several seconds to several tens seconds before the end of the arc discharge, the shutter 35 is activated so as to cover the substrate 7 to be processed. The shutter 35 is held in such a state as to be electrically insulated from the processing chamber 6. As occasion demands, a voltage can be applied to the shutter 35. Dependence of the effect of reducing electrically charged particles upon the voltage applied to the shutter 35 has a tendency similar to that of FIG. 3. Therefore, this applied voltage is set to, for example, a value in the range of 10 V to 90 V, or preferably a value in the range of 40 V to 60 V.

TABLE 1 shows the relation between the number of particles on the substrate 7 to be processed which become particles and the electric field filter 16 and the neutral filter 23 collectively.

TABLE 1

| | Number of Particles on Substrate to be Processed | | | | | |
|---|---|---|---|---|---|---|
| Configuration of Particle Filter | The Number of Particles having Diameter in the Range of 1 to 2 $\mu$m | The Number of Particles having Diameter in the Range of 2 to 3 $\mu$m | The Number of Particles having Diameter in the Range of 3 to 5 $\mu$m | The Number of Particles having Diameter of at least 5 $\mu$m | Total Number of Particles having Diameter of at least 1 $\mu$m | Density of Particles having Diameter of at least 1 $\mu$m |
| Neutral and Electric Field Particle Filter | 42 | 5 | 3 | 11 | 61 | 0.51 |
| Only Neutral Particle Filter | 410 | 101 | 21 | 28 | 560 | 4.60 |
| Without Filter | 3606 | 1495 | 719 | 706 | 6526 | 59.89 |

The condition of the arc discharge in the experiment is made the same as that of the first embodiment shown in FIG. 1. The shutter 35 is kept in the floating state with respect to the ground voltage. During a period of 10 seconds after the start of the arc discharge and during a period of 10 seconds before the end of the arc discharge, the shutter 35 is activated to cover the surface of the substrate 7 to be processed. The area of the substrate 7 to be processed is approximately 100 cm$^2$.

As a result, an extremely large number of particles (including electrically charged particles and neutral particles) each having a particle diameter of at least 1 μm which becomes particles are transported onto the substrate 7 to be processed, in the case where neither the electric field filter 16 nor the neutral filter 23 is used. On the other hand, if the neutral filter 23 is used, then neutral particles are removed, and hence particles sticking onto the substrate 7 to be processed (most of which is occupied by electrically charged particles) can be drastically reduced to at most 1/10 of the above described case. Furthermore, it has been revealed that the quantity can be reduced to at most 1/100 by further using the electric field filter 16.

In other words, in plasma processing utilizing an arc discharge, electrically charged particles included in the generated plasma 11 can be removed by using the electric field filter 16 and neutral particles can be removed by using the neutral filter 23. In the case of thin film forming or the like, therefore, processing can be conducted by using extremely clean plasma with particles exerting a bad influence on devices excluded.

The shutter 35 may be formed of a metal material similar to that of the electric field filter 16. Furthermore, the above described electrically insulative organic macromolecule material may be disposed on the particle capture surface of the shutter 35. When the particle capture surface is a conductive surface, a direct current voltage from the direct current supply 20 is applied to the shutter 35. When an organic macromolecule material is disposed on the particle capture surface, a direct current voltage component generated by using the high frequency supply 41 is applied to the shutter 35.

Figure 13:
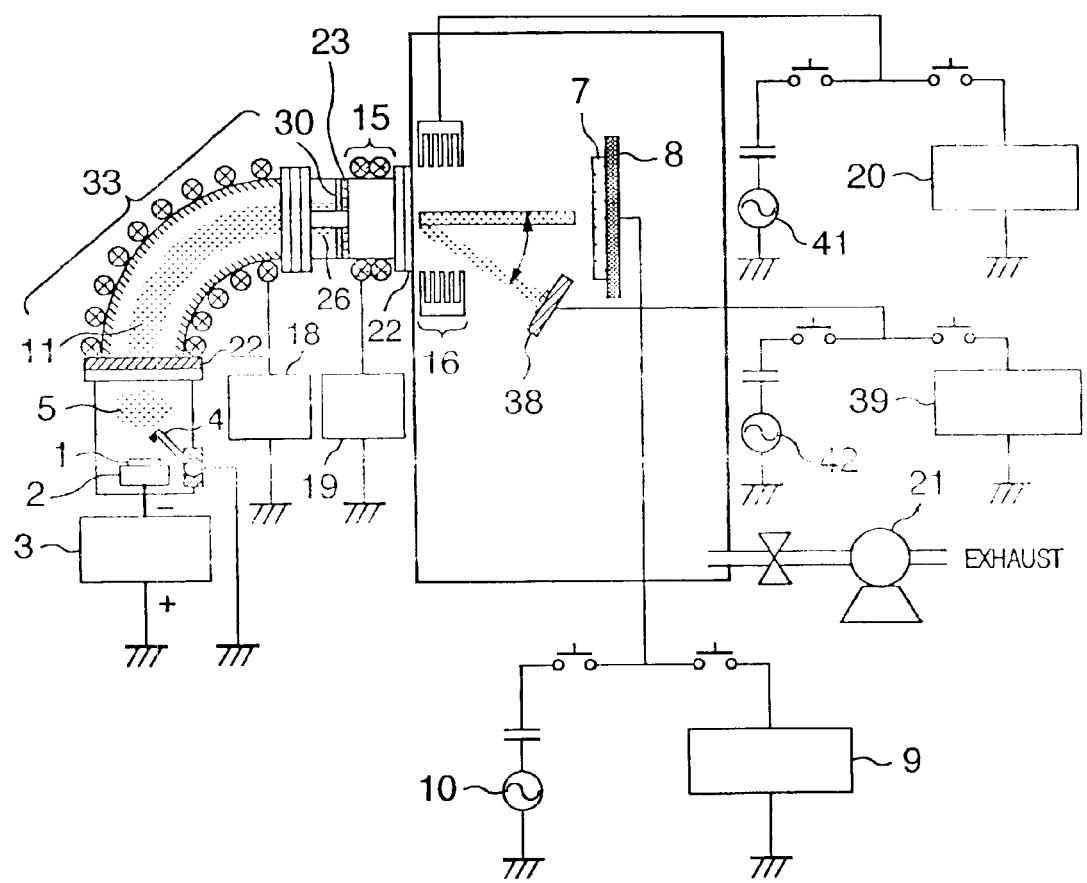
FIG. 13 is a schematic diagram of a plasma processing device showing a seventh embodiment.

FIG. 13 is a schematic configuration diagram showing a seventh embodiment of a plasma processing device according to the present invention. Numeral 38 denotes a substrate for dust collection, and numeral 39 denotes a direct current supply. Numeral 42 denotes a high frequency supply. Components corresponding to FIG. 11 are denoted by like numerals, and description thereof will be omitted.

With reference to FIG. 13, the seventh embodiment differs from the sixth embodiment shown in FIG. 11 in that the substrate for dust collection 38 is disposed in a position different from the position of the substrate 7 to be processed, instead of the shutter 35.

By controlling the magnetic field of a second magnetic field duct 15 during a period in the range of several seconds to several tens seconds after the start of the arc discharge and during a period in the range of several seconds to several tens seconds before the end of the arc discharge, the travel direction of the plasma 11 which has passed through a first magnetic field duct 14 is changed to the substrate for dust collection 38, in the seventh embodiment. As a result, plasma processing can be executed while avoiding the time when a large quantity of particles are readily generated.

The substrate for dust collection 38 may be the same structural member as the substrate 7 to be processed. As occasion demands, a predetermined voltage can be applied to the substrate for dust collection 38. Furthermore, by conducting processing using polyimide or the like on the surface of the substrate for dust collection 38, it is possible to prevent particles peeling off the surface of the substrate for dust collection 38 from floating within the processing chamber 6 again and exerting a bad influence during processing of the substrate 7 to be processed.

When the surface of the substrate for dust collection 38 is a conductive surface, a direct current voltage from the direct current supply 39 is applied to the substrate for dust collection 38. When an organic macromolecule material is disposed on the surface of the substrate for dust collection 38, a direct current voltage component generated by using the high frequency supply 42 is applied to the substrate for dust collection 38.

Dependence of the effect of reducing particles upon the voltage applied to the substrate for dust collection 38 has a tendency similar to that of FIG. 3. Therefore, the voltage applied to the substrate for dust collection 38 is also the same as that of the case of the electric field filter 16 and the shutter 35 (FIG. 11) described earlier.

As a method for obtaining an effect similar to that of the seventh embodiment shown in FIG. 13, it is possible that a stage 8 is provided with a rotatable structure and mount both the substrate 7 to be processed and the substrate for dust collection 38 on the stage 8. At the time of start and end of the arc discharge, the travel direction of the plasma 11 is squared with the position of the substrate for dust collection 38 by rotating the stage 8. By using this method, an effect similar to that of the above described case can be obtained.

Identities of particles removed by the electric field filter 16 and the neutral filter 23 were examined. A result of the examination will hereafter be described.

Figure 14A:
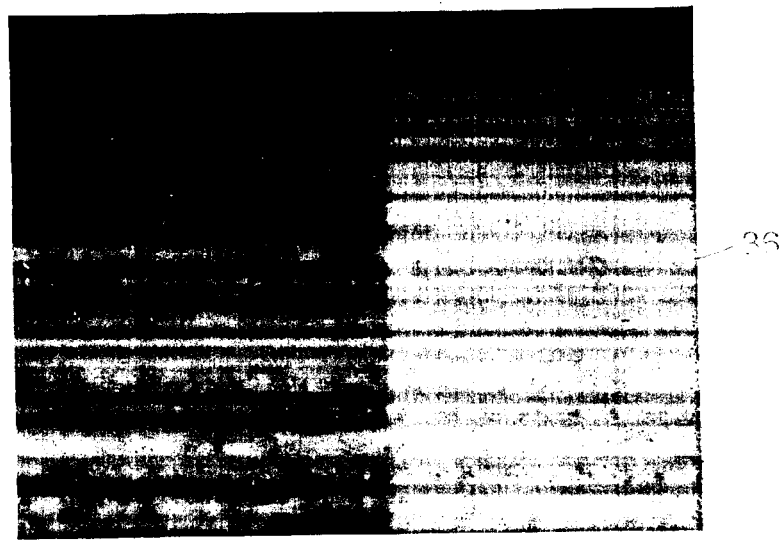
FIGS. 14A and 14B show an example of Raman spectral analysis of a particle (having a size of approximately 2.5 by 7 $\mu$m)

A large particle 36 (approximately 2.5×7 μm) sticking to the substrate 7 to be processed shown in FIG. 14A was analyzed by using well known micro-Raman spectroscopy.

Figure 14B:
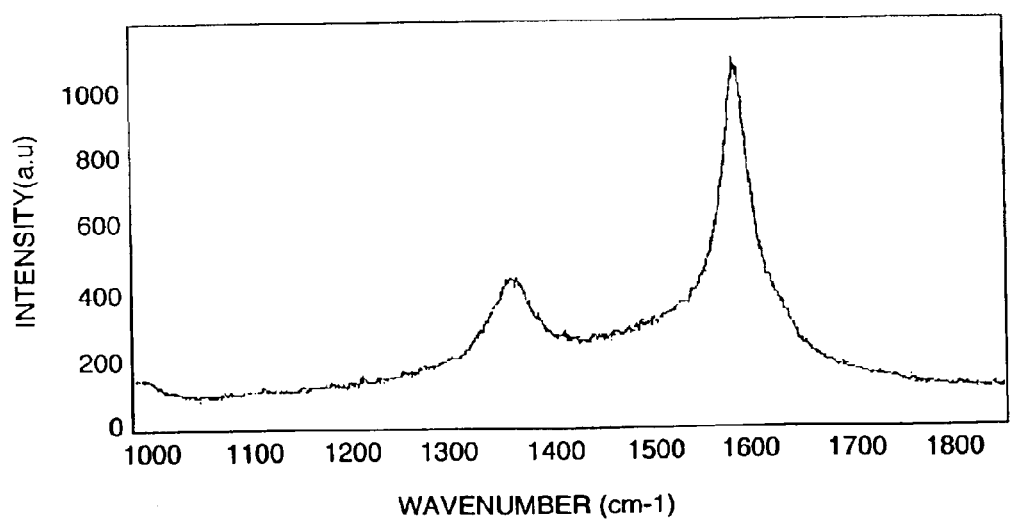

FIG. 14B shows an example of Raman spectra obtained as the result. The Raman spectra are observed in the vicinity of 1580 cm-1 and 1350 cm-1 in wave number. It is thus ascertained that the particle 23 is a particle akin to graphite carbon.

Figure 15A:
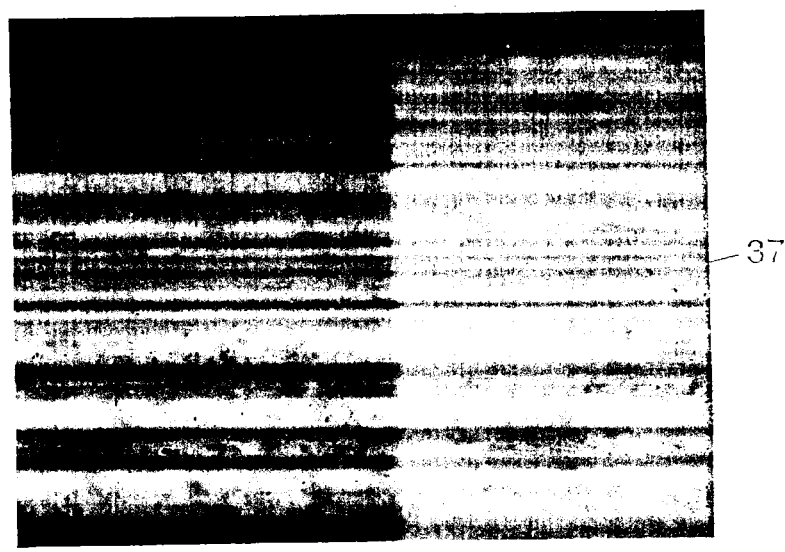
FIGS. 15A and 15B show an example of Raman spectral analysis of a particle (having a particle diameter of approximately 1 $\mu$m)
Figure 15B:
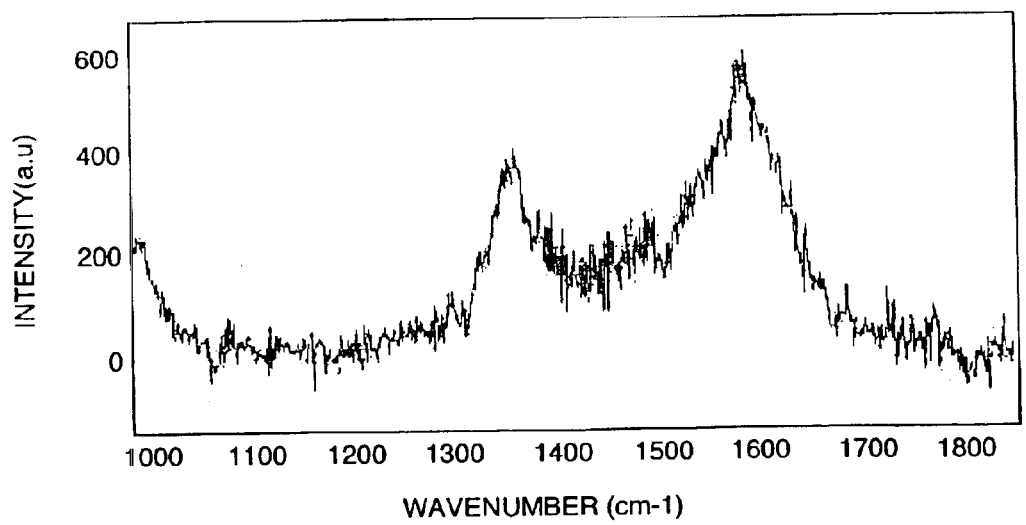

FIG. 15A shows a particle 37 having a particle diameter of approximately 1 μm. Its Raman spectra are shown in FIG. 15B. As compared with the case of FIG. 14B, only the intensity of Raman spectra has decreased, and the wave number of spectra is the same. Therefore, the particle 37 is also a particle akin to graphite carbon.

FIGS. 16A, 16B, 17A, 17B, 18A and 18B show results of a component analysis conducted on particles having different sizes by using the well known energy dispersive X-ray fluorescent analysis.

Figure 16A:
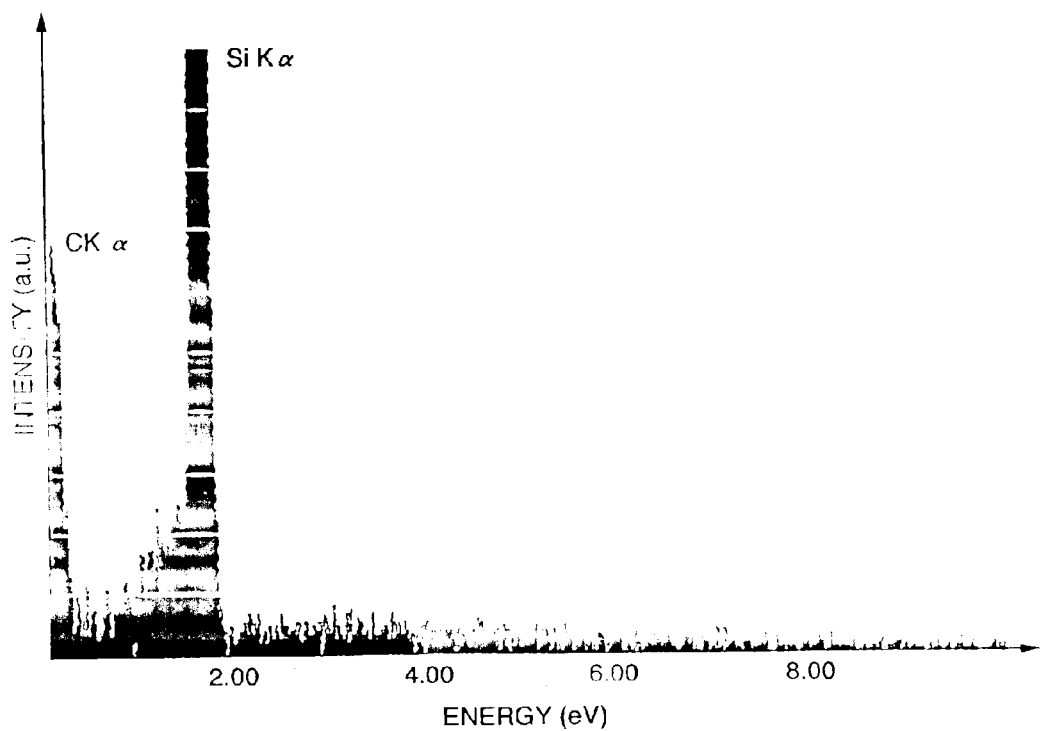
FIGS. 16A and 16B show a first example of a component analysis of a particle using an energy dispersive X-ray fluorescent analysis.
Figure 16B:
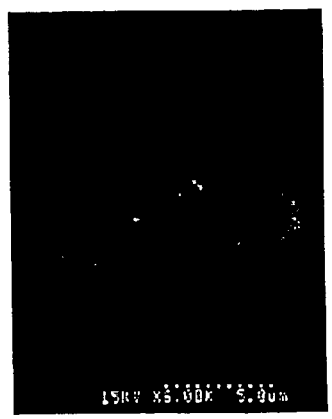
Figure 17A:
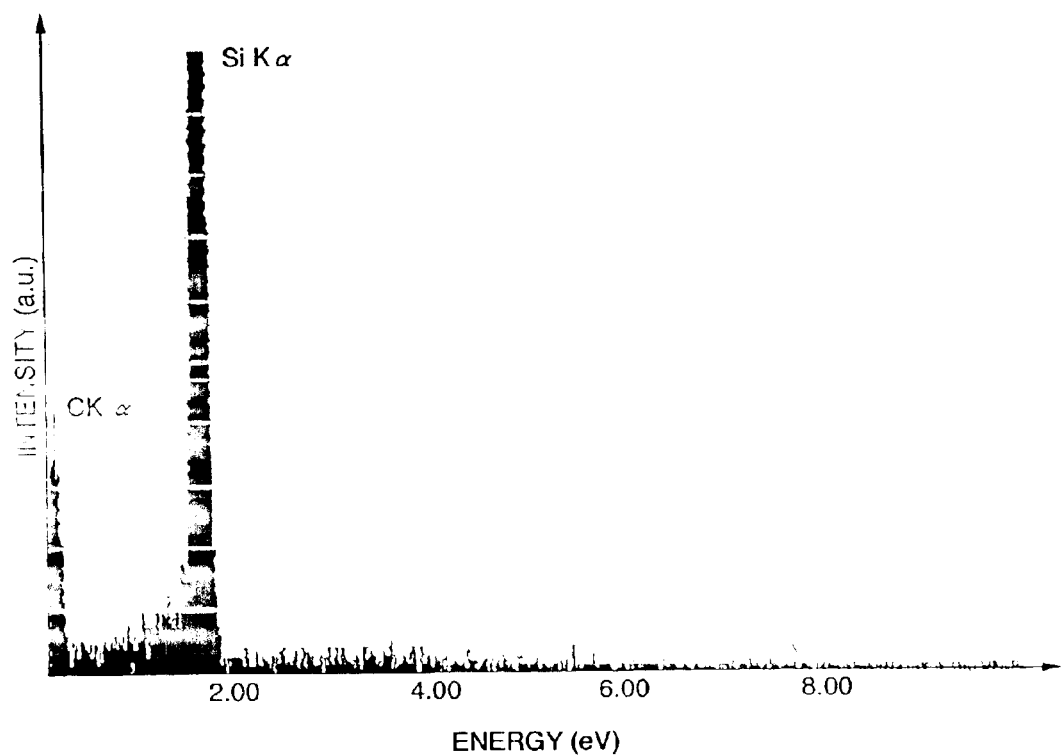
FIGS. 17A and 17B show a second example of a component analysis of a particle using an energy dispersive X-ray fluorescent analysis.
Figure 17B:
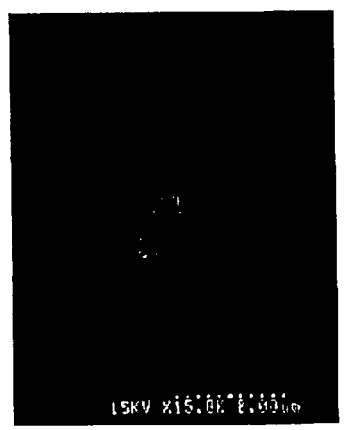

Judging from shapes of scanning electron microscope photographs shown in FIGS. 16B and 17B, the particles are considered to be neutral particles because the shapes of the particles have acute-angled sides. From results of their component analysis, it can be said that these particles are particles formed of carbon. However, a peak belonging to silicon and appearing in spectra of the component analysis is a signal fed from a silicon wafer used as an underlying substrate.

Figure 18A:
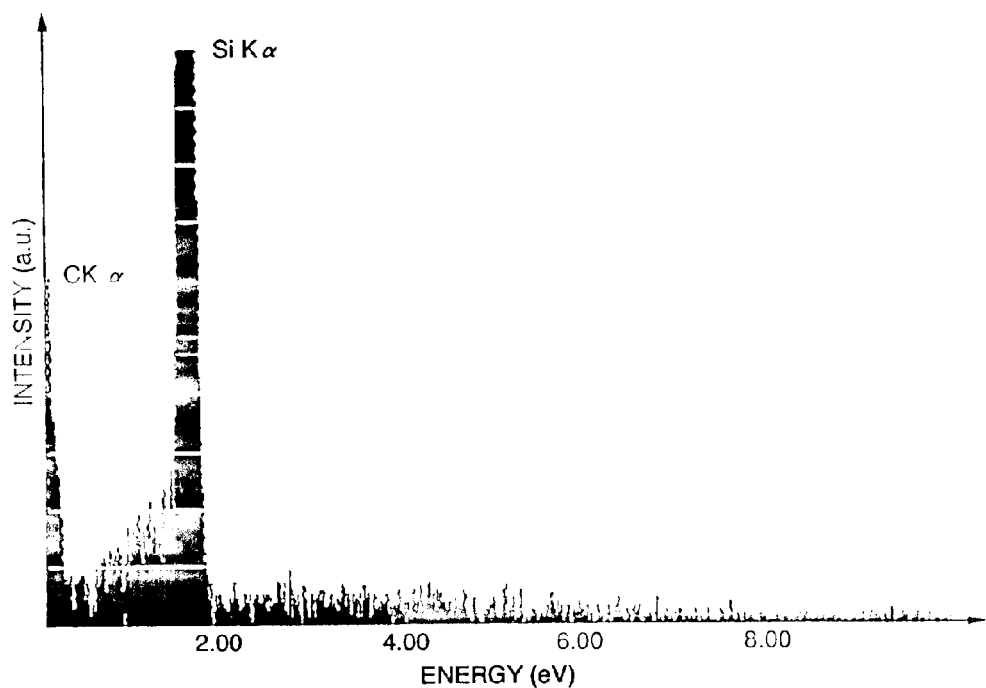
FIGS. 18A and 18B show a third example of a component analysis of a particle using an energy dispersive X-ray fluorescent analysis.
Figure 18B:

On the other hand, as for the particle shown in FIG. 18B, its shape is roundish. Therefore, the particle is guessed to be an electrically charged particle transported on the substrate to be processed with several thousands electrons electrified around it. As a result of the component analysis, it has been found that this particle is also formed of carbon.

As described above, particles floating in plasma generated by an arc discharge are particles akin to graphite carbon. They include electrically charged particles and electrically neutral particles. Both of them are structures which are of little utility value as, for example, a thin film and which are inferior crystallographically as well, when they are deposited on the substrate to be processed. Therefore, removal of them are indispensable.

In the embodiments heretofore described, carbon is used as the target 1. The target material is not limited to carbon. For example, metal having a high melting point, such as tungsten, may be used so long as it is a material allowing an arc discharge.

In the above described embodiments, one electric field filter 16 is used. However, at least two electric field filters 16 may be arranged in the flow direction of the plasma 11. In this case, diameters of opening portions of all electric field filters 16 may be made equal, or may be made different suitably. As a matter of course, voltages applied to these may be made equal, or may be made different suitably. For example, in the case where at least two electric field filters are arranged along the central axis 40 in the embodiment shown in FIG. 1, an electric field filter 16 disposed nearer the second magnetic field filter 15 may have a larger diameter of its opening portion or may have a smaller diameter of its opening portion, as compared with an electric field filter disposed near the substrate 7 to be processed.

According to the present invention, a neutral filter having a penetration hole and electromagnetic filters which can be supplied with voltages are disposed in a transportation course of plasma generated by an arc discharge, as heretofore described. As a result, plasma with neutral particles and electrically charged particles can be applied to a substrate to be processed.

What is claimed is:

1. A plasma processing device comprising:

a plasma generation unit for generating plasma by using a cathodic arc discharge;

first and second magnetic field ducts arranged in a row for transporting the plasma in a direction, one end of the row being connected to said plasma generation unit;

a processing chamber connected to an other end of the row and having a stage for holding a substrate to be processed;

said substrate being disposed so as to oppose the transport directions of said plasma generated by said plasma generation unit and transported through said first and second magnetic field ducts into said processing chamber, and said first and second magnetic field ducts and said processing chamber being kept in vacuum state;

said first magnetic field duct being supplied with a predetermined voltage for trapping said plasma into a beam form substantially around a central axis of said first magnetic field duct;

said second magnetic field duct being supplied with a predetermined voltage for causing the beam of said plasma to swing;

at least one electric field filter being supplied with a predetermined voltage and being disposed between said second magnetic field duct and said substrate to be processed, said at least one electric filter being kept in such a state as to be electrically insulated from said processing chamber;

said at least one electric field filter having an opening portion for passing at least said transported plasma therethrough, and said opening portion being disposed so as to form a concentric circle with respect to a flow of said transported plasma;

wherein said predetermined voltage applied to said at least one electric field filter comprises a direct current voltage generated by using direct current supply or a direct current supply component generated by using a high frequency supply, and said voltage is set to a value in a range of 50 to 60 V as compared with a ground voltage; and wherein at least one shutter is provided for covering said plasma during one of a period of a predetermined time after start of said arc discharge and a period of a predetermined time before the end of said arc discharge, said shutter being disposed between said at least one electric field filter and said substrate to be processed, said shutter being movable, said shutter being capable of being supplied with a voltage, and said shutter being kept in such a state as to be electrically insulated from said processing chamber.

2. A plasma processing device according to claim 1, wherein said voltage applied to said shutter comprises a direct current voltage generated by using one of a direct current supply and a direct current supply component generated by using a high frequency supply, and said voltage is set to a value in a range of 10 to 90 V as compared with a ground voltage.

* * * * *